US007834792B2

(12) United States Patent
Sherry et al.

(10) Patent No.: US 7,834,792 B2
(45) Date of Patent: Nov. 16, 2010

(54) SYNCHRONOUS ANALOG TO DIGITAL CONVERSION SYSTEM AND METHOD

(75) Inventors: Adrian Sherry, Raheen (IE); Tomas Tansley, Fenit (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/453,686

(22) Filed: Jun. 15, 2006

(65) Prior Publication Data
US 2006/0290556 A1 Dec. 28, 2006

Related U.S. Application Data

(60) Provisional application No. 60/691,363, filed on Jun. 17, 2005.

(51) Int. Cl.
*H03M 1/48* (2006.01)
(52) U.S. Cl. ...................................... 341/155
(58) Field of Classification Search ................ 341/139, 341/155, 156; 324/111
See application file for complete search history.

(56) References Cited

U.S. PATENT DOCUMENTS

| 3,960,010 | A | * | 6/1976 | Gustafsson | 341/126 |
| 4,016,557 | A | * | 4/1977 | Zitelli et al. | 341/139 |
| 6,268,820 | B1 | * | 7/2001 | Sherry et al. | 341/155 |
| 6,414,619 | B1 | * | 7/2002 | Swanson | 341/155 |

OTHER PUBLICATIONS

Analog Device, Application Note AN-559, Jun. 2000,Analog Device, Rev A, p. 1-22.*
Analog Device, Datasheet for AD7755, Aug. 2000, Analog Device Rev B, p. 1-16.*
Texas Instruments, Datasheet for bq2084, SLUS550A, Jul. 2003, Texas Instruments, Rev A,p. 1-60.*
Texas Instruments, Datasheet for bq29312, SLUS546C, Oct. 2003, Texas Instruments, Rev C, p. 1-30.*

* cited by examiner

*Primary Examiner*—Bao Q Vu
*Assistant Examiner*—Jue Zhang
(74) *Attorney, Agent, or Firm*—Kenyon & Kenyon LLP

(57) ABSTRACT

Synchronous analog to digital conversion including providing a voltage analog to digital converter and a current analog to digital converter, synchronizing the converters, providing a signal conditioning circuit associated with the input of each converter, providing a current input to one of the signal conditioning currents and a voltage input to the other; and processing the inputs with gains differing by substantially an order of magnitude with substantially balanced time delays; and providing those conditioned inputs to the associated converters.

22 Claims, 6 Drawing Sheets

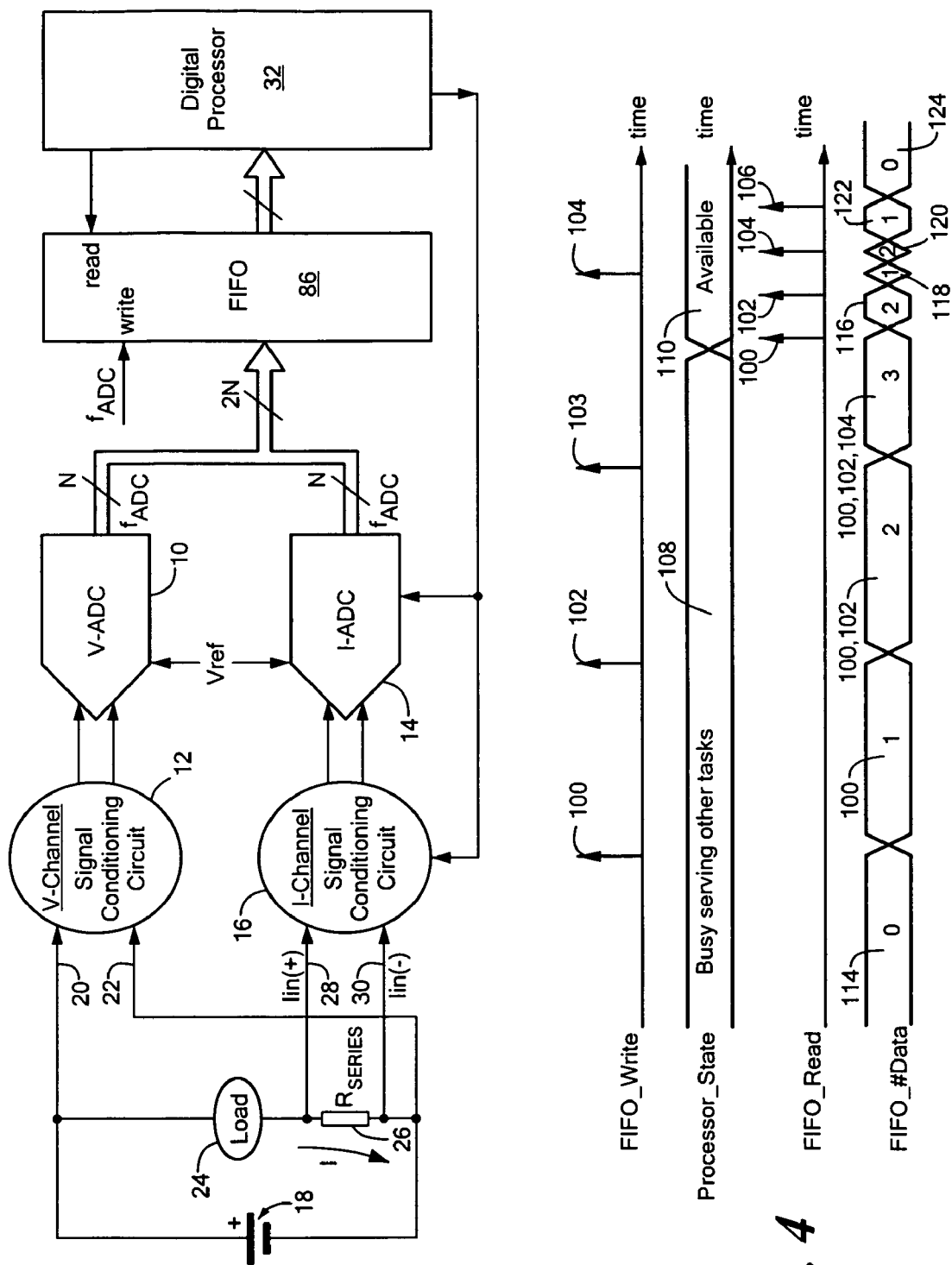

SYNCHRONOUS ANALOG TO DIGITAL CONVERSION SYSTEM AND METHOD

RELATED APPLICATIONS

This application claims benefit of U.S. Provisional Application Ser. No. 60/691,363 filed Jun. 17, 2005. This application is incorporated herein by this reference.

FIELD OF THE INVENTION

This invention relates to a synchronous analog to digital conversion system and method which balances the time delays of the signal conditioning circuits which provide input to the analog to digital converters.

BACKGROUND OF THE INVENTION

It is advantageous to be able to measure two or more signals virtually simultaneously. A battery measurement system can be used to determine the capacity of a battery at a point in time. It requires the measurement of the battery terminal voltage, the battery current drawn and, optionally, the battery temperature, and subsequent processing of these results.

However, to accurately determine the remaining charge in the battery and the battery's ability to deliver that charge it is required that the battery voltage and battery current must be measured so that the measured data reflects the state of these parameters with a minimum timing delay between them. This measured data is processed by algorithms running on a digital processor that implement the calculations required to determine the capacity of the battery. This is particularly the case in an automotive battery measurement system, where the ability of the battery to deliver charge can be determined from simultaneously measuring these battery parameters when large currents are being drawn, for example when the engine is being started.

In a typical analog-to-digital converter (ADC), anti-aliasing (AA) filters are generally required before the ADC, to limit the aliasing of signals at frequencies greater than one-half of the ADC sampling rate into the signal bandwidth. These anti-aliasing filters introduce delays in the signal path, affecting the synchronicity of the measured signals, (signals presented to the ADC) and they generally add cost and area. The anti-aliasing filters are generally combined with other circuitry to form signal-conditioning circuits. These signal-conditioning circuits have to perform other tasks in addition to providing anti-alias filtering, for example, attenuation or amplification of the input signals in a battery measurement system.

In a battery measurement system, signals representing the battery voltage and current are applied to one or more ADCs, and the results of the ADC conversions generally undergo some processing in a digital processor to determine the capacity of the battery. The digital processor typically also performs other tasks, such as communicating information about the state of the battery to a host processor over a communications interface, or storing parameter data into non-volatile memory. If the processor is busy servicing another task, such as a communication protocol, it is possible that ADC conversions may be missed because the processor is not available to process this data. This could result in the loss of information about the state of the battery, for example if this occurs during a period of large current flow when the synchronized voltage and current data is required.

In a battery measurement system there may be periods of time when the measurement system is required to enter a state of lower power consumption. In this state it may be required to continue to perform a certain level of measurement of battery performance, but possibly of only one battery parameter and with limited processing of this data. After a particular set of measurement criteria has been met, it maybe required to automatically exit from the lower power consumption state and then recommence the synchronous voltage and current conversions and subsequent calculations required of the algorithm to determine the capacity of the battery.

In a battery measurement system it is generally required to measure the temperature of the battery or its local environment. This measurement could be either performed by a dedicated ADC or by multiplexing the signal from a temperature transducer into one of the ADCs present for measuring voltage or current, in which case this ADC must return to be synchronous with the other ADC when the temperature measurement is complete.

SUMMARY OF THE INVENTION

It is therefore an object of this invention to provide an improved synchronous analog to digital conversion system and method which balances signal conditioning delays through different signal conditioning circuits.

It is a further object of this invention to provide an improved synchronous analog to digital conversion system and method which simultaneously measures the input signals to the conditioning circuits.

It is a further object of this invention to provide an improved synchronous analog to digital conversion system and method for simultaneously measuring battery voltage and current.

It is a further object of this invention to provide an improved synchronous analog to digital conversion system and method in which the simultaneity of measurement can be as close as 5 µsecs.

It is a further object of this invention to provide an improved synchronous analog to digital conversion system and method in which the signal conditioning circuits may have gains differing by approximately an order of magnitude or greater.

It is a further object of this invention to provide an improved synchronous analog to digital conversion system and method in which the converters and at least one of the signal conditioning circuits are in an integrated circuit package.

It is a further object of this invention to provide an improved synchronous analog to digital conversion system and method which provides for storage and subsequent retrieval of simultaneously measured inputs.

It is a further object of this invention to provide an improved synchronous analog to digital conversion system and method which provides for recovery, in response to a predetermined condition, from a low power to a higher power consumption operating state while preserving simultaneity of measurement of the input signals.

It is a further object of this invention to provide an improved synchronous analog to digital conversion system and method which provides for temperature measurement of a battery in addition to or alternately with the voltage or current without loss of simultaneity of delivery of the input signals during or after the measurement of temperature.

The invention results from the realization that a synchronous analog to digital conversion system which balances the time delays of the signal conditioning circuits that provide input to the analog to digital converters so that the input signals conditioned by the signal conditioning circuits reach the converters virtually simultaneously though the signal conditioning circuits may be different, e.g., have gains differing by approximately an order of magnitude or more.

The subject invention, however, in other embodiments, need not achieve all these objectives and the claims hereof should not be limited to structures or methods capable of achieving these objectives.

This invention features a synchronous analog to digital conversion system including first and second synchronized analog to digital converters and first and second signal conditioning circuits, one associated with the input of each of the converters, respectively. The signal conditioning circuits have gains differing by substantially an order of magnitude or greater and have substantially balanced time delays for simultaneously providing conditioned inputs to the converters.

In a preferred embodiment the first signal conditioning circuit may respond to the voltage across a battery and the second to a voltage representative of the currents applied by the battery to a load. The first signal conditioning circuit may include first and second filter circuits. The first filter circuit may include an attenuator circuit. The second filter circuit may be coupled between the first filter circuit and the first analog to digital converter. The second signal conditioning circuit may include third and fourth filter circuits. The fourth filter circuit may include a gain amplifier. The fourth filter circuit may be coupled between the third filter circuit and the analog to digital converter. The second signal conditioning circuit may include a level shifter circuit for adjusting the common mode of the input to the gain amplifier. There may an ADC synchronizing circuit for synchronizing operation of the analog to digital converters. There may be a digital processor for enabling the ADC synchronizing circuit. There may be a threshold detector circuit responsive to one of the converters outputs exceeding a predetermined level for commanding the digital processor to enable the other of the converters. There may be a buffer storage for storing the synchronized outputs of both converters for simultaneous retrieval. There may be a temperature transducer. There may be a switching circuit for selectively coupling the temperature transducer and the first signal conditioning circuit to the first converter. There may be a third analog to digital converter responsive to the temperature transducer. The converters may be converters. The first signal conditioning circuit, the first and second converters, and the fourth filter circuit may be in an integrated circuit package and the third filter circuit may be out of the package. At least one of the signal conditioning circuits, the converters and digital processors may be in an integrated circuit package.

This invention also features a synchronous analog to digital conversion system including first and second synchronized analog to digital converters, and first and second signal conditioning circuits, one associated with the input of each of the converters, respectively. The signal conditioning circuits have gains differing by substantially an order of magnitude or greater and have substantially balanced time delays for simultaneously providing conditioned inputs to the converters. The converters and at least one of the conditioning circuits are in an integrated circuit package.

This invention also features a battery measurement system for simultaneously measuring voltage and current including first and second synchronized analog to digital converters and first and second signal conditioning circuits, one associated with the input of each of the converters, respectively. The first signal conditioning circuit responds to the voltage across a battery and the second responds to a voltage representative of the currents applied by the battery to a load. The signal conditioning circuits have gains differing by substantially an order of magnitude or greater and have substantially balanced time delays for simultaneously providing conditioned inputs to the converters.

This invention also features a battery measurement system for simultaneously measuring voltage and current including a current analog to digital converter, a voltage analog to digital converter and an ADC synchronizing circuit for synchronizing operation of the analog to digital converters. There are first and second signal conditioning circuits, one associated with the input of each of the converters, respectively. The first signal conditioning circuit is responsive to the voltage across a battery and the second is responsive to a voltage representative of the currents applied by the battery to a load. The signal conditioning circuits have gains differing by substantially an order of magnitude or greater and have substantially balanced time delays for simultaneously providing conditioned inputs to the converters.

This invention also features a battery measurement system for simultaneously measuring voltage and current including a current analog to digital converter, a voltage analog to digital converter, an ADC synchronizing circuit for synchronizing operation of the analog to digital converters, and a digital processor for enabling the ADC synchronizing circuit. There are first and second signal conditioning circuits, one associated with the input of each of the converters, respectively. The first signal conditioning circuit is responsive to the voltage across a battery and the second is responsive to a voltage representative of the currents applied by the battery to a load. The signal conditioning circuits have gains differing by substantially an order of magnitude or greater and have substantially balanced time delays for simultaneously providing conditioned inputs to the converters.

This invention also features a battery measurement system for simultaneously measuring voltage and current including a current analog to digital converter, a voltage analog to digital converter and an ADC synchronizing circuit for synchronizing operation of the analog to digital converters. There are first and second signal conditioning circuits, one associated with the input of each of the converters, respectively. The first signal conditioning circuit is responsive to the voltage across a battery and the second is responsive to a voltage representative of the currents applied by the battery to a load. The signal conditioning circuits have gains differing by substantially an order of magnitude or greater and have substantially balanced time delays for simultaneously providing conditioned inputs to the converters. The first signal conditioning circuit includes first and second filter circuits; the first filter circuit includes an attenuator circuit. The second filter circuit is coupled between the first filter circuit and an analog to digital converter. The second signal conditioning circuit includes third and fourth filter circuits. The fourth filter circuit includes a gain amplifier and is coupled between the third filter circuit and an analog to digital converter.

This invention also features a method of synchronous analog to digital conversion including providing a voltage analog to digital converter and a current analog to digital converter; synchronizing the converters; providing a signal conditioning circuit associated with the input of each converter; providing a current input to one of the signal conditioning currents and a voltage input to the other; and processing the inputs with gains differing by substantially an order of magnitude with substantially balanced time delays; and providing those conditioned inputs to the associated the converters.

BRIEF DESCRIPTION OF THE DRAWINGS

Other objects, features and advantages will occur to those skilled in the art from the following description of a preferred embodiment and the accompanying drawings, in which:

FIG. 3 is a view of a schematic block diagram of a system similar to FIG. 1 with a buffer storage;

FIG. 4 illustrates waveforms depicting the operation of FIG. 3;

DISCLOSURE OF THE PREFERRED EMBODIMENT

Figure 1:
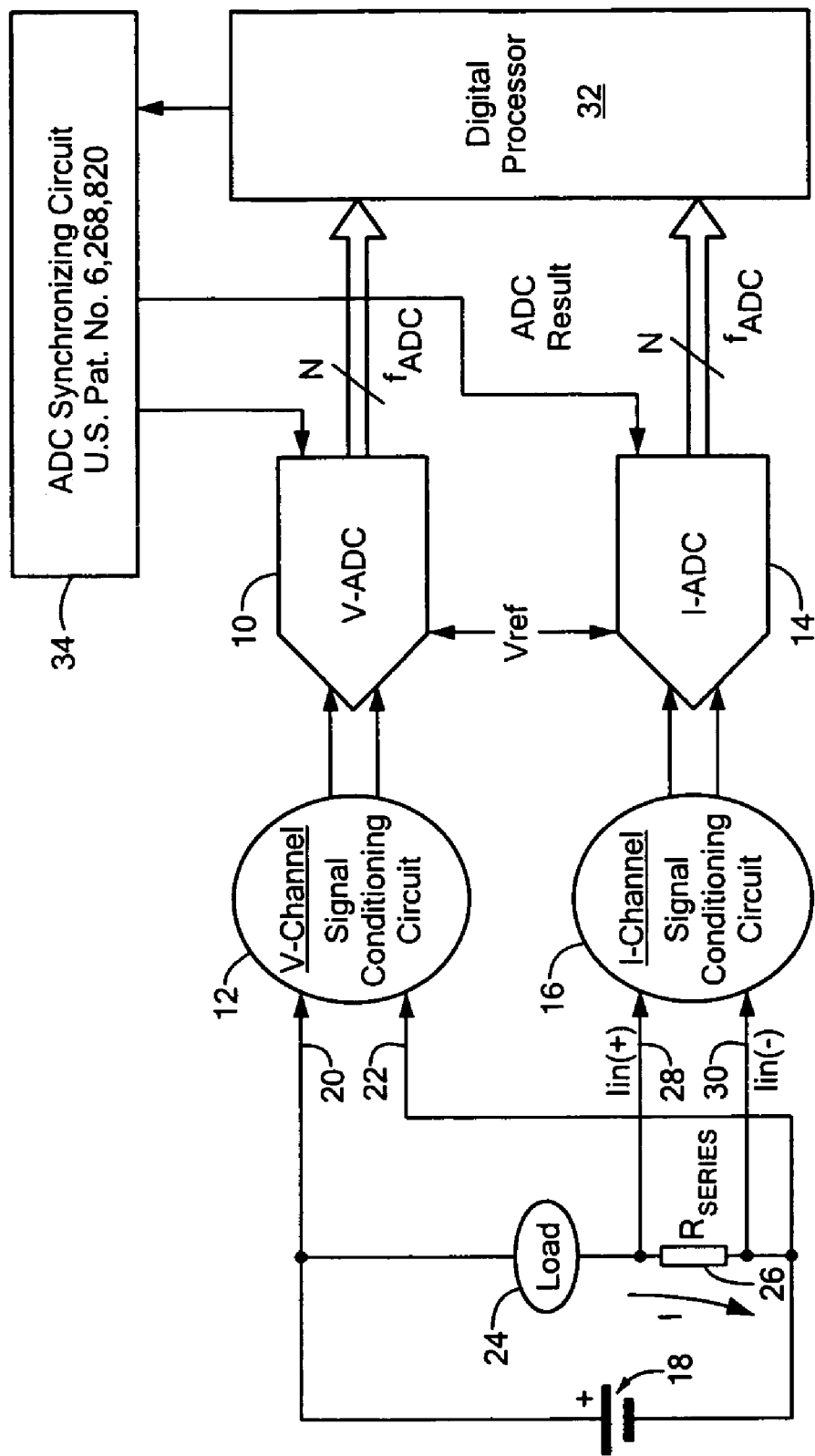
FIG. 1 is a schematic block diagram of a synchronous analog to digital conversion system with balanced signal conditioning circuits according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

While the invention is broadly applicable to an analog to digital converter system which balances the time delays of a plurality of signal conditioning circuits that provide input to analog to digital converters so that the signals from the signal conditioning circuits reach the converters virtually simultaneously, the specific application disclosed here is a battery measurement system where the signal conditioning circuits typically include anti-aliasing filters and there are typically two sets of ADCs and signal conditioning circuits, one for measuring battery voltage and one for measuring battery current.

In a battery measurement system the voltage across the battery terminals and the voltage resulting from the current through a (small) series/sense resistor are passed through respective signal conditioning circuits (including anti-aliasing filters), and applied to two analog-to-digital converters (ADCs), one for the current measurement (I-ADC) and one for the voltage measurement (V-ADC). The ADC outputs are passed to a digital processor. The ADCs sample their inputs and provide their outputs simultaneously, as described in U.S. Pat. No. 6,268,820. An example ADC architecture used in such measurement systems is a sigma-delta ADC, where the ADC consists of a sigma-delta modulator followed by a digital filter.

The signal conditioning circuits are, in general, different for the battery voltage measurement and the current measurement channels. For example the battery voltage signal conditioning generally requires the battery voltage to be attenuated to a suitable level that the ADC can accommodate, while the current measurement path requires amplification of the small signal produced across the series resistor to make use of the full dynamic range of the ADC and minimize noise introduced in the conversion process. Any unbalanced delays through the signal conditioning circuits affects the synchronicity of the battery voltage and current measurements.

The distinction should be understood between the prior art teaching of synchronicity or synchronizing of the ADCs as taught by this inventor's prior U.S. Pat. No. 6,268,820 and the simultaneity of measurement achieved by balancing the delay of the signal conditioning circuits so that they deliver their signals simultaneously, to their respective ADCs regardless of how different those signal conditioning circuits may be.

U.S. Pat. No. 6,268,820 describes an analog to digital conversion system having a plurality of ADCs with different degrees of conversion performance where the digital words are produced at substantially the same time. A controller is provided for interrupting and/or changing the configuration of one or more of the ADCs. The controller provides the interrupt and/or change in configuration with a priority to one of the ADCs over the other one of the ADCs.

This scheme can be used to guarantee synchronicity of the measurements within the analog-to-digital-converter system, however it does not address timing mismatch through preceding signal-conditioning states. If such a system were to be used in a battery measurement system, an unbalanced delay introduced in the anti-alias filtering (signal conditioning circuits) stage could result in lower accuracy calculations of the battery state.

There are a number of requirements on the transfer function characteristics of the signal conditioning circuits. The first requirement on the signal conditioning circuits is to provide anti-aliasing to the following ADCs. This requires attenuation of frequencies that can alias back towards DC as a result of the sampled-data nature of the ADC. This requirement is typically specified as a minimum attenuation required at half the ADC sampling frequency and higher frequencies. With an over sampled ADC such as a sigma-delta ADC, the sampling rate of the ADC is much higher than the ADC conversion rate, which eases somewhat the anti-alias requirements.

The second requirement is to minimize the difference in delays through the different signal conditioning paths. This difference in delays needs to be kept within a specified tolerance, so that two synchronized sampling ADCs can measure the battery voltage and current states with a simultaneity within this specified tolerance. The calculation of the worst-case delay needs to take into account the manufacturing tolerances inherent in the manufacture of the devices comprising the signal-conditioning circuits, since it is not possible to manufacture devices to a perfect precision.

There is shown in FIG. 1 a synchronous analog to digital conversion system including a voltage ADC 10 serviced by voltage channel signal conditioning circuit 12 and a current ADC 14 serviced by current channel signal conditioning circuit 16. Voltage signal conditioning circuit 12 senses the voltage across battery 18 on inputs 20 and 22 and generally attenuates that voltage as well as filters the signal before delivering it to voltage ADC 10. This is so because the battery voltage could reach up to e.g. 18 volts while the ADC input is restricted to e.g. plus or minus 1.2 volts. The battery current through load 24 passes through series resistor 26, a relatively small resistance of approximately 100µΩ. The voltage across resistor 26 represents the current I being delivered by battery 18 and is provided on inputs 28 and 30 to the I-channel signal conditioning circuit 16. This voltage is a very small voltage in the neighborhood of 1mV-150mV and so signal conditioning circuit 16 will have to gain up the voltage to achieve the plus or minus 1.2 volts acceptable to ADC 14. Even though signal conditioning circuits 12 and 16 may vary widely in their construction and performance in accordance with this invention they are designed with balanced delays so that the voltage and the current measured at inputs 20, 22, and 28, 30, respectively, will be essentially, virtually simultaneously delivered to the inputs of ADCs 10 and 14 as required. The outputs of ADCs 10 and 14 are delivered to digital processor 32 for further processing.

Also present in FIG. 1 is ADC synchronizer circuit 34 which is disclosed in U.S. Pat. No. 6,268,820, having the same inventor and assignee, which is herein incorporated in its entirety by this reference. Synchronizer circuit 34 ensures that ADCs 10 and 14 are always in synchronism. This coupled with the balanced delays imposed in signal conditioning circuits 12 and 16 ensure that the representations of the voltage and current will be simultaneously sensed and delivered to ADCs 10 and 14 and simultaneously output by those ADCs.

Figure 2:
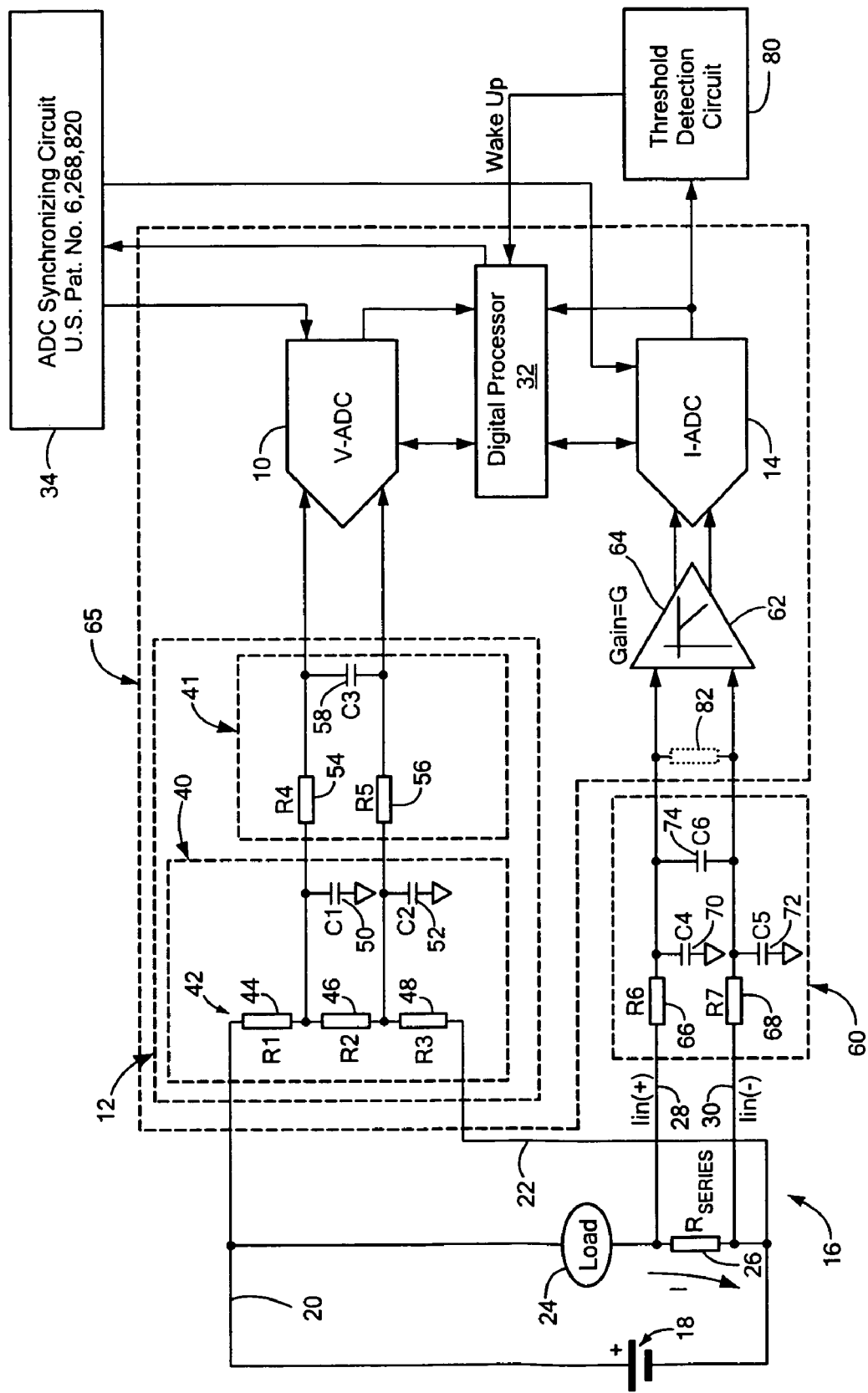
FIG. 2 is a more detailed schematic block diagram of the system of FIG. 1 with added synchronicity, thresholding and level shifting.

Signal conditioning circuit 12 includes a second order filter including first filter 40, FIG. 2, and second filter 41. Filter 40 includes attenuator 42 having three resistors 44, 46, and 48 and two capacitors 50 and 52. Filter 41 includes two resistors 54 and 56 and one capacitor 58. Filter 41 may follow filter 40 as shown or filter 40 may follow filter 41. Signal conditioning circuit 16 is also shown including a second order filter including a first filter 60 and a second filter 62 which is formed from gain amplifier 64. Filter 60 is shown including resistors 66 and 68 and capacitors 70, 72 and 74. Although not shown there could be buffer amplifiers between each of the signal conditioning circuits 12 and 16 and their respective ADCs 10 and 14. The attenuation or scaling factor providing by signal conditioning circuit 12 may be expressed as Resistor 46/(Resistor 44+Resistor 46+Resistor 48).

In one embodiment the performance required of signal conditioning circuits 12 and 16 was to achieve −40 dB additional rejection at a frequency of 1 MHz and for there to be less than 5 µs delay between the voltage measurement and the current measurement. This led to the use of the second order filters so that the roll off frequency could be placed at a relatively higher frequency which reduces the delay or phase shift introduced at the lower frequencies where the signal of interest resides. This also allows the 5 µs delay target to be met taking into account a plus/minus 20% component mismatch on the components of the respective signal conditioning circuits. Advantageously, signal conditioning circuit 12, ADCs 10 and 14 and the gain amplifier 64 and even digital processor 32 may be disposed on one or more integrated circuit chips in a single package 65. The use of relatively large resistors 44, 46, 48, 54 and 56 makes it possible to use smaller capacitors 50, 52 and 58 which are more easily disposed on integrated circuits with the resistors without consuming excessive die area. The ADCs used are ΣΔ ADCs. The resistors 44, 46, 48, 54, 56 and capacitors 50, 52 and 58 in signal conditioning circuit 12 are matched with respect to the resistors 66, 68 capacitors 70, 72 and 74 and the bandwidth of gain amplifier 64 in signal conditioning circuit 16 so that the signal delays through the two conditioning circuits are equalized or balanced to provide the desired simultaneity of presentation of the signals at their respective ADCs 10 and 14. This can be seen from their values which provide a 5 µs maximum delay in the simultaneity of the voltage and current measurement.

Typical parameters of interest in a battery monitoring system are shown in Table 1.

TABLE 1

| Parameter | Value |
| --- | --- |
| FP (frequency range of interest) | 1 kHz |
| FSAMP(ADC) | 1 MHz |
| FA; Attenuation at FSAMP(ADC) | −40 dB |
| TS; Simultaneity of Voltage and Current Measurements | 5 us |
| ADC Reference Voltage | 1.2 V |
| Max Battery Voltage | 18 V |
| Max Battery Current | 1500 A |

In this case, signals with frequency content up to $F_P$=1 kHz must be measured to a simultaneity of $T_S$=5 us. The values for $F_P$, $F_{SAMP(ADC)}$, and $T_S$ may differ depending on the application of the battery being measured, but in general the simultaneity, $T_S$, required will be much less than $1/F_P$. The ADCs are automatically exactly synchronized; therefore the anti-aliasing filters and other signal-conditioning circuitry on the voltage and current channels need to be balanced to have delays that match to within 5 us. To enable an ADC with a 1.2V reference to measure a battery voltage of 18V an attenuator (divider) is implemented in the voltage measurement signal-conditioning circuitry. An attenuation of at least 1/15 and possibly higher is used for this. The current-measurement signal-conditioning circuitry includes a gain amplifier to amplify the small voltage produced across $R_{SERIES}$ by the current flowing through the load on the battery. This gain is programmable to accommodate the wide range in current levels during active or idle states of the load. For a current of up to 1500 A, a minimum gain of eight can be used. The gain-amplifier 64 includes some filtering stages. One measurement channel must therefore perform amplification of its input signal and another measurement channel must perform attenuation of its input signal, while maintaining a specified maximum simultaneity between the two conditioned signals presented to the ADCs. The difference in minimum gain/attenuation between the two channels is large: (8/(1/15))=120. The exact relationship between the gain on one channel and the attenuation of the other channel will vary depending on such factors as the ADC and reference voltage used. However in general there will be a large difference, e.g. an order of magnitude between the signal-conditioning required on the two channels.

The signal-conditioning and anti-aliasing filters used on each channel are therefore different, because the input voltage amplitudes presented are very different on each channel.

To meet the specified simultaneity and attenuation conditions, the component values used were:

TABLE 2

| V-ADC | | I-ADC | |
| --- | --- | --- | --- |
| R1 | 3.15 MOhm | R6 | 2.2 kOhm |
| R2 | 140 kOhm | R7 | 2.2 kOhm |
| R3 | 70 kOhm | C4 | 0.1 nF |
| C1 | 2.5 pF | C5 | 0.1 nF |
| C2 | 2.5 pF | C6 | 1 nF |
| R4 | 300 kOhm | RSERIES | 100 uOhm |
| R5 | 300 kOhm | F3dB (Amp) | 260 kHz |
| C3 | 9 pF | Gain (Amp) | 4 to 64 |
| Attenuation | 1/24 | | |

The voltage-channel incorporates the attenuator as part of the first stage of anti-alias filtering. The current-channel incorporates the gain-stage as part of the second stage of anti-alias filtering. The difference in delays through the two signal-conditioning stages is matched to within the target value, even though very different filtering is used in each of the stages. This achieves 40 dB attenuation at $F_{SAMP(ADC)}$ and has less than 5 us delay between the two channels, even in the presence of +/−10% component variation. The nominal delay on the current channel is 5.3 us, while the nominal delay on the voltage channel is 6.9 us, giving a difference in delay of 1.6 us.

Also shown in FIG. 2 is a threshold detector circuit 80 which detects when the current sensed by ADC 14 exceeds a predetermined threshold. Up to that point digital processor 32 maintains the system in a low power state. Upon a signal from threshold detector circuit 80 however, digital processor brings the system to full power to measure both the battery voltage and the current simultaneously.

In certain modes of operation, it is necessary to minimize the power consumption of a battery measurement system. In this case, generally only a single battery parameter is measured (and often at a lower level of accuracy,) e.g. current, while the processor is placed in a minimally active state. If the ADC threshold detector circuit detects a large increase in current, or a certain time period has elapsed, a signal is passed to the processor. This places the processor in an active state whereby it can request high accuracy synchronized measurements of the battery current and voltage. The start of the voltage and current ADC conversions must be synchronized, so a method similar to U.S. Pat. No. 6,268,820 is implemented to delay the start of the conversions of one or other ADC until it can be guaranteed that the conversion results will be synchronous.

At this point too, digital processor 32 will enable ADC synchronizing circuit 34 to synchronize the operation of the "sleeping" ADC 10 with the operating ADC 14. Alternatively, threshold detector circuit 80 may be associated with ADC 10 which would be operating in the low power mode and ADC 14 would be the one that is turned on and synchronized by ADC synchronizer circuit 34.

Also present in FIG. 2 is level shifter circuit 82 which can be used to shift the common mode voltage, for example, at the input to gain amplifier 64.

To allow the synchronous, simultaneous, measurements of voltage and current to continue while the processor is busy, a temporary storage area may be implemented where the ADCs can store their results until the processor is ready. This is a first in first out (FIFO) memory storage area. The ADCs write the results into the FIFO independent of the processor activity so that the processor can independently read the ADC results when it is ready to process them. The two ADCs write their results into one FIFO address simultaneously. The voltage result in the upper bytes of the memory and the current result in the lower bytes of the memory, for example. This guarantees that the voltage and current data read from a FIFO location will be the result of synchronous and simultaneous measurements of voltage and current. An interrupt signal is generated if the FIFO is almost full so that the processor is told that the ADC data is about to be lost if the processor does not read the FIFO before the next ADC results arise.

This is shown in FIG. 3 where FIFO 86 is disposed between the outputs of ADCs 10 and 14 and digital processor 32. For example, as shown in FIG. 4, the outputs from ADCs 10 and 14 occur periodically 100, 102, 104, 106 but because the processor is busy servicing other tasks 108, it cannot retrieve the outputs 100-106 from the converters. However, when time becomes available 110, processor 32 can read all four of the converter inputs 100-106. The filling and emptying of FIFO 86 is shown by waveform 112 where initially there is no data 114. After converter output 100 there is one piece of data, after converter outputs 100, and 102 there are two pieces of data, after converter outputs 100, 102, and 104 there are three pieces of data. Then during the period of time 110, the processor begins to retrieve the data in FIFO 86 dropping the data packets from three to two as shown at 116 to one as shown at 118 then with the arrival of converter outputs 106, FIFO again contains two data packets 120 after further processing 122 there remains no data 124 in FIFO 86.

Figure 5:
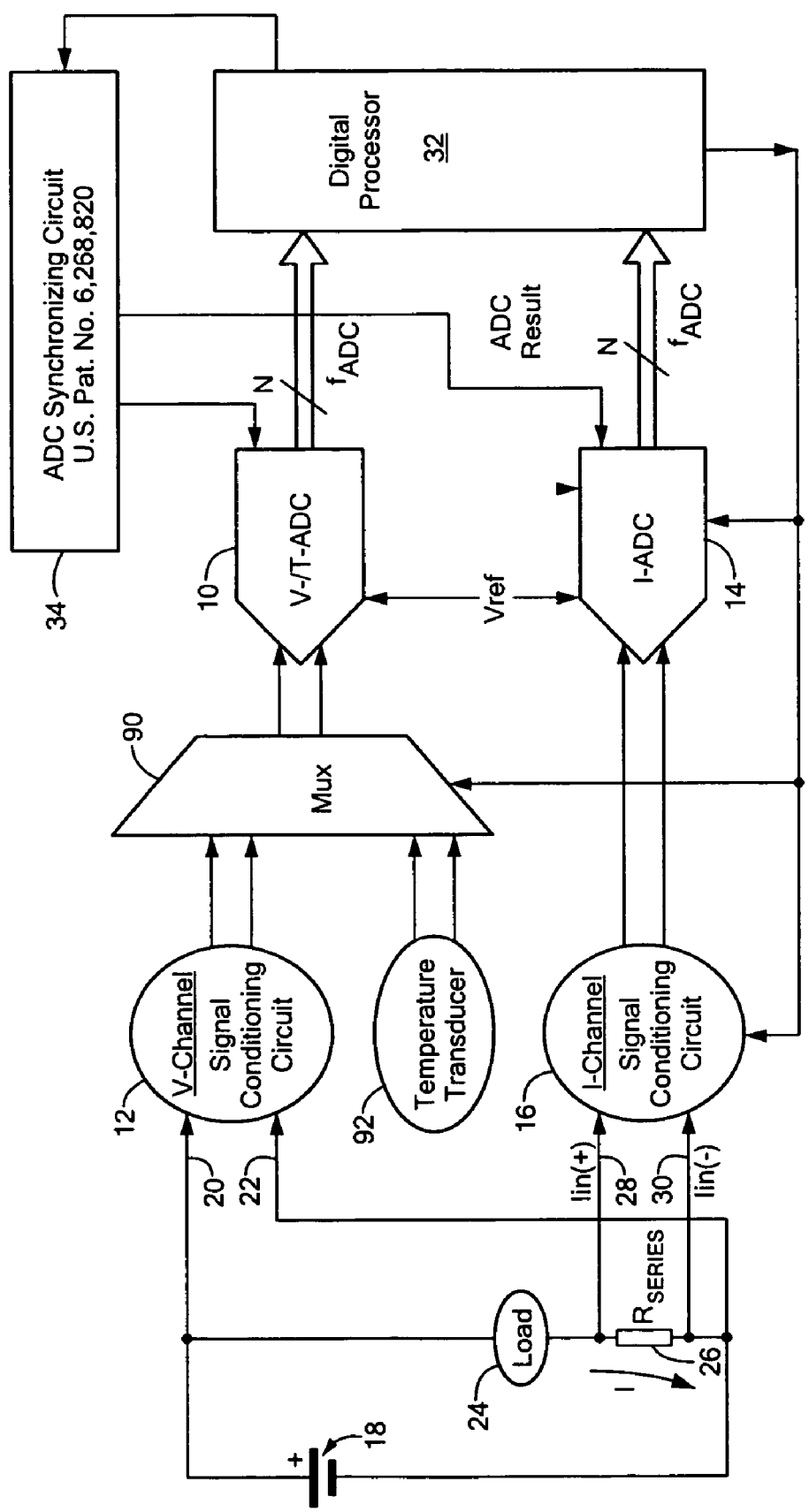
FIG. 5 is a view similar to FIG. 1 with a sharing of an ADC with one of the signal conditioning circuits.
Figure 6:
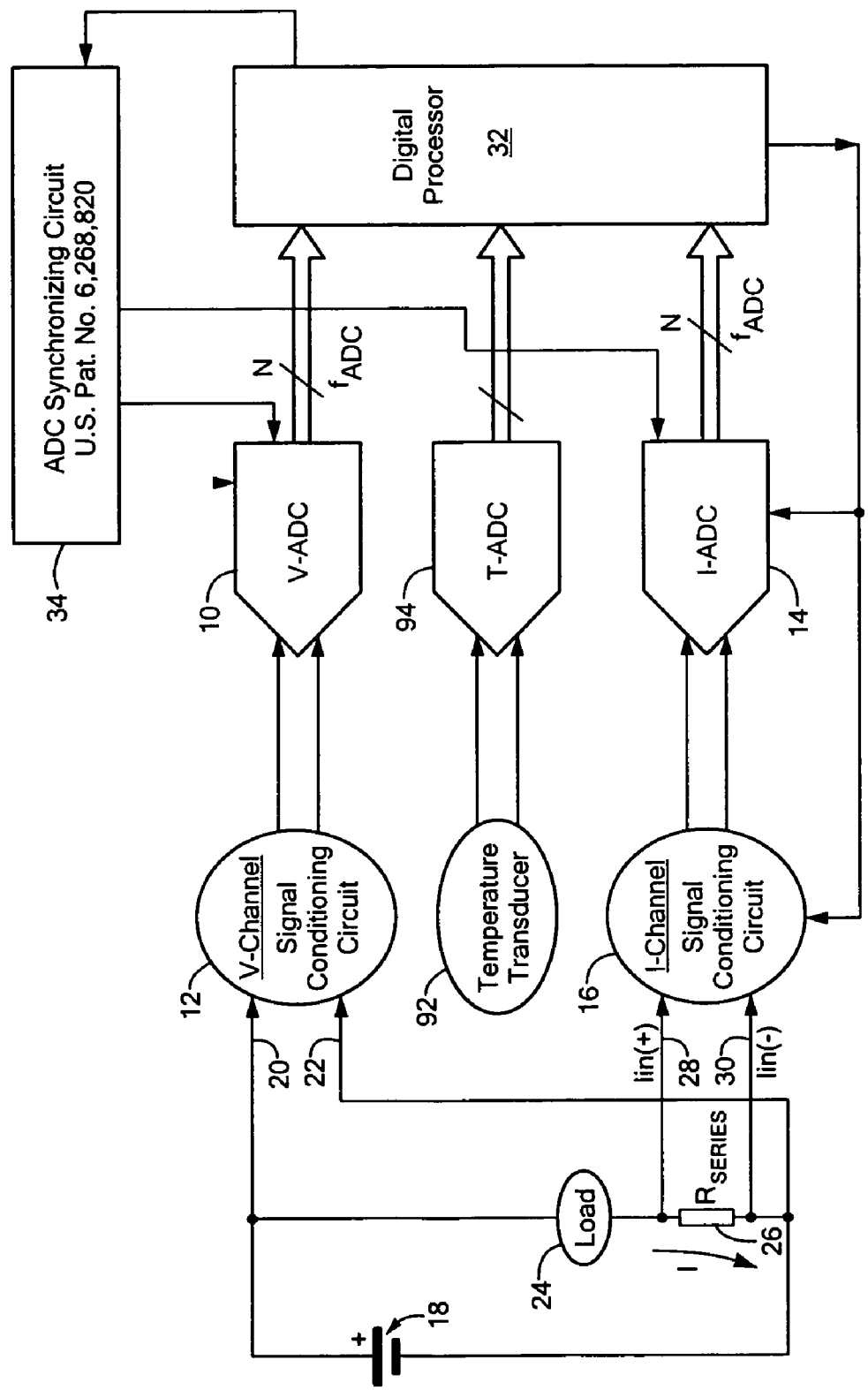
FIG. 6 is a view similar to FIG. 1 with a temperature transducer having its own ADC.

The third parameter that is designed to be measured in battery measurement systems is temperature. This is done via a temperature transducer which converts the temperature into voltage or current that can be converted to a digital form by an ADC. One approach is to interrupt one ADC, for example, the voltage channel measurement, temporarily, and convert the temperature signal to digital making use of some or all of the voltage ADC. A multiplexer can be used in front of the ADC to selectively connect the voltage signal conditioning circuit or the temperature transducer to the voltage ADC. Once the conversion is complete the voltage channel conversions must be reestablished in such a way that the voltage and current conversions are once again synchronized as previously explained using the ADC synchronizer circuit 34 disclosed in U.S. Pat. No. 6,268,820. Such an approach is shown in FIG. 5 where mux 90 under control of digital processor 32 can selectively connect the output of signal conditioning circuit 12 or temperature transducer 92 to ADC 10. When the mux returns the output of signal conditioning circuit 12 to ADC 10, ADC synchronizer circuit 34 once again synchronizes the operation of voltage ADC 10 with operation of current ADC 14. Alternatively, as shown in FIG. 6, temperature transducer 92 may be provided with its own temperature ADC 94 so that it can independently provide temperature to digital processor 32. In this case, the synchronous measurement of the current and voltage is not interrupted by performing a measurement of temperature.

Figure 7:
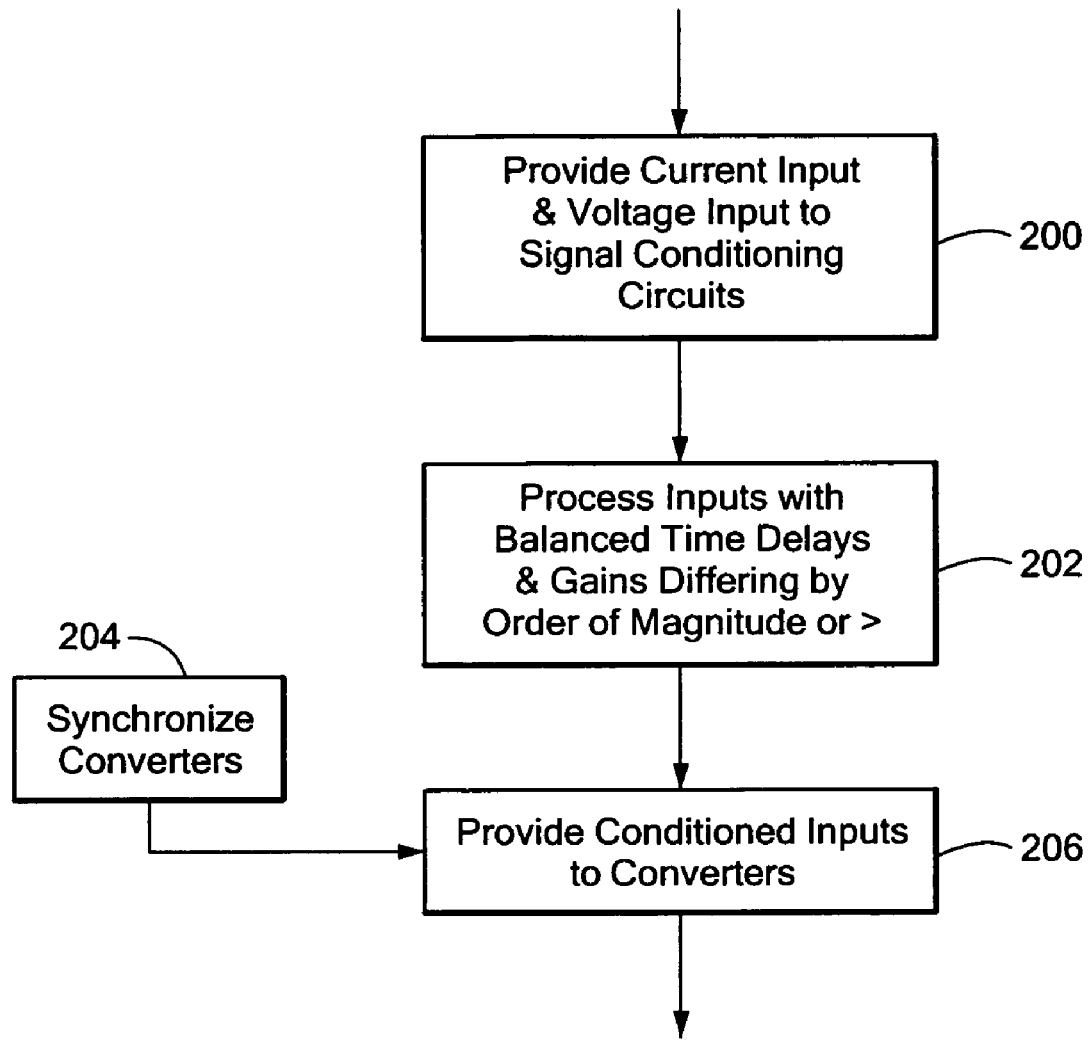
FIG. 7 is an illustration of the method according to this invention.

This invention also involves a method of synchronous analog to digital conversion which includes providing a current output and a voltage input to signal conditioning circuits, 200, FIG. 7, and then processing those inputs with balanced time delays and gain differing by an order of magnitude or more 202. The converters are synchronized 204 and the conditioned inputs are submitted 206 to the synchronized converters.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A synchronous analog to digital conversion system comprising:
   first and second synchronized analog to digital converters;
   an ADC synchronizing circuit for synchronizing operation of said first and second analog to digital converters;
   a first signal conditioning circuit responsive to a first direct current signal, said first signal conditioning circuit is associated with an input of said first analog to digital converter, wherein said first signal conditioning circuit has a first gain and a first time delay;
   a second signal conditioning circuit responsive to a second direct current signal, said second signal conditioning circuit is associated with an input of said second analog to digital converter, wherein said second signal conditioning circuit has a second gain and a second time delay, said second gain differs from said first gain by at least an order of magnitude;
   wherein said first time delay and said second time delay are balanced based upon a specified tolerance such that a first output of said first signal conditioning circuit based upon said first direct current signal is provided to said input of said first analog to digital converter at substantially the same time as a second output of said second signal conditioning circuit based upon said second direct current signal is provided to said input of said second analog to digital converter.

2. The synchronous analog to digital conversion system of claim 1 in which said first signal conditioning circuit responds to the voltage across a battery and said second responds to a voltage representative of the currents applied by the battery to a load.

3. The synchronous analog to digital conversion system of claim 1 in which said first signal conditioning circuit includes first and second filter circuits.

4. The synchronous analog to digital conversion system of claim 3 in which said first filter circuit includes an attenuator circuit.

5. The synchronous analog to digital conversion system of claim 3 in which said second filter circuit is coupled between said first filter circuit and said first analog to digital converter.

6. The synchronous analog to digital conversion system of claim 1 in which said second signal conditioning circuit includes third and fourth filter circuits.

7. The synchronous analog to digital conversion system of claim 6 in which said fourth filter circuit includes a gain amplifier.

8. The synchronous analog to digital conversion system of claim 7 in which said fourth filter circuit is coupled between said third filter circuit and said analog to digital converter.

9. The synchronous analog to digital conversion system of claim 7 in which said second signal conditioning circuit includes a level shifter for adjusting the common mode of the input to said gain amplifier.

10. The synchronous analog to digital conversion system of claim 1 further including a digital processor for enabling said ADC synchronizing circuit.

11. The synchronous analog to digital conversion system of claim 10 further including a threshold detector circuit responsive to one of said converter outputs exceeding a predetermined level for commanding said digital processor to enable the other of said converters.

12. The synchronous analog to digital conversion system of claim 1 further including a buffer storage for storing the synchronized outputs of both converters for simultaneous retrieval.

13. The synchronous analog to digital conversion system of claim 1 further including a temperature transducer.

14. The synchronous analog to digital conversion system of claim 13 further including a switching circuit for selectively coupling said temperature transducer and said first signal conditioning circuit to said first converter.

15. The synchronous analog to digital conversion system of claim 13 further including a third analog to digital converter responsive to said temperature transducer.

16. The synchronous analog to digital conversion system of claim 1 in which said converters are 2 A converters.

17. The synchronous analog to digital conversion system of claim 7 in which said first signal conditioning circuit, said first and second converters and said fourth filter circuit are in an integrated circuit package and said third filter circuit is out of package.

18. The synchronous analog to digital conversion system of claim 1 in which at least one of said signal conditioning circuits and said converters are in an integrated circuit package.

19. The synchronous analog to digital conversion system of claim 10 in which at least one of said signal conditioning circuits, said converters and said digital processor are in an integrated circuit package.

20. A synchronous analog to digital conversion system comprising:
    first and second synchronized analog to digital converters;
    an ADC synchronizing circuit for synchronizing operation of said first and second analog to digital converters;
    a first signal conditioning circuit responsive to a first direct current signal, said first signal conditioning circuit is associated with an input of said first analog to digital converter, wherein said first signal conditioning circuit has a first gain and a first time delay;
    a second signal conditioning circuit responsive to a second direct current signal, said second signal conditioning circuit is associated with an input of said second analog to digital converter, wherein said second signal conditioning circuit has a second gain and a second time delay, said second gain differs from said first gain by at least an order of magnitude;
    wherein said first time delay and said second time delay are balanced based upon a specified tolerance such that a first output of said first signal conditioning circuit based upon said first direct current signal is provided to said input of said first analog to digital converter at substantially the same time as a second output of said second signal conditioning circuit based upon said second direct current signal is provided to said input of said second analog to digital converter; wherein said first and second synchronized analog to digital converters and at least one of said conditioning circuits being in an integrated circuit package.

21. A method of synchronous analog to digital conversion comprising:
    providing a voltage analog to digital converter and a current analog to digital converter;
    synchronizing said converters by an ADC synchronizing circuit;
    providing a first signal conditioning circuit responsive to a first direct current signal, said first signal conditioning circuit is associated with an input of said voltage analog to digital converter, wherein said first signal conditioning circuit has a first gain and a first time delay;
    providing a second signal conditioning circuit responsive to a second direct current signal, said second signal conditioning circuit is associated with an input of said current analog to digital converter, wherein said second signal conditioning circuit has a second gain and a second time delay, said second gain differs from said first gain by at least an order of magnitude;

processing said inputs with time delays balanced based upon a specified tolerance; and providing conditioned inputs to the associated said converters such that a first output of said first signal conditioning circuit based upon said first direct current signal is provided to said input of said voltage analog to digital converter at substantially the same time as a second output of said second signal conditioning circuit based upon said second direct current signal is provided to said input of said current analog to digital converter.

22. A synchronous analog to digital conversion system comprising:

a first analog to digital converter;

a second analog to digital converter;

a signal attenuation circuit responsive to a first direct current signal, said signal attenuation circuit is coupled to an input of said first analog to digital converter, wherein said signal attenuation circuit has a first gain and a first time delay;

a signal amplification circuit responsive to a second direct current signal, said signal amplification circuit is coupled to an input of said second analog to digital converter, wherein said signal amplification circuit has a second gain and a second time delay; wherein said second gain differs from said first gain by at least an order of magnitude; and a synchronizer circuit to synchronize said first analog to digital converter and said second analog to digital converter;

wherein said first time delay and said second time delay are balanced based upon a specified tolerance such that a first output of said signal attenuation circuit based upon said first direct current signal is provided to said input of said first analog to digital converter at substantially the same time as a second output of said signal amplification circuit based upon said second direct current signal is provided to said input of said second analog to digital converter.

* * * * *